United States Patent [19]
Kanno

[11] Patent Number: 6,087,903
[45] Date of Patent: Jul. 11, 2000

[54] VOLTAGE-CONTROLLED OSCILLATOR WITH VARIABLE OUTPUT FREQUENCY FROM OSCILLATION CIRCUIT

[75] Inventor: Hiroshi Kanno, Tokyo, Japan

[73] Assignee: NEC Corporation, Tokyo, Japan

[21] Appl. No.: 09/080,235

[22] Filed: May 18, 1998

[30] Foreign Application Priority Data

May 23, 1997 [JP] Japan ..................................... 9-133638

[51] Int. Cl.[7] .............................. H03B 5/04; H03L 7/099
[52] U.S. Cl. .............................. 331/57; 331/74; 331/186; 331/175; 331/177 R; 331/34; 327/270; 327/274
[58] Field of Search .............................. 331/57, 74, 186, 331/175, 177 R, 34; 327/270, 274

[56] References Cited

U.S. PATENT DOCUMENTS 4,616,189 10/1986 Pengue, Jr. .............................. 330/253

OTHER PUBLICATIONS

David Reynolds, "A 320 MHz CMOS Triple 8 bit DAC with On–Chip PLL and Hardware Cursor", IEEE Journal of Solid–State Circuits, vol. 29. No. 12, Dec. 1994, pp. 1545–1551.

*Primary Examiner*—Arnold Kinkead
*Attorney, Agent, or Firm*—Young & Thompson

[57] ABSTRACT

A voltage-controlled oscillator has a feedback circuit connected to the gate of a transistor which controls a current flowing through an oscillation unit. The feedback circuit applies a voltage depending on the DC voltage of an oscillated signal to the gate of the transistor. When the oscillated signal is reduced in level to lower the DC voltage, the feedback circuit lowers the voltage applied to the gate of the transistor. The current flowing through the oscillation unit is reduced to increase the level of the oscillated signal. When the oscillated signal is increased to increase the DC voltage, the feedback circuit increases the voltage applied to the gate of the transistor. The current flowing through the oscillation unit is increased to reduce the level of the oscillated signal. The feedback process prevents the voltage-controlled oscillator from operating unstably regardless of manufacturing variations of transistors from design values.

10 Claims, 3 Drawing Sheets

VOLTAGE-CONTROLLED OSCILLATOR WITH VARIABLE OUTPUT FREQUENCY FROM OSCILLATION CIRCUIT

BACKGROUND OF THE INVENTION

1. Field of the Invention

The present invention relates to a voltage-controlled oscillator, and more particularly to a voltage-controlled oscillator having a control circuit for applying an input voltage to vary an output frequency from an oscillation circuit.

2. Description of the Related Art

One conventional voltage-controlled oscillator is illustrated in FIG. 1 of the accompanying drawings. As shown in FIG. 1, the conventional voltage-controlled oscillator, generally designated by the reference numeral 1, has a control circuit 2 and an oscillation circuit 3 which comprises a plurality of differential amplifiers successively connected in a ring pattern.

Specifically, the oscillation circuit 3 comprises three oscillation units 4, 5, 6 each comprising a differential amplifier. Each of the oscillation units 4, 5, 6 has five transistors 11, 12, 13, 14, 15.

The transistor 11, which is a first controlled load transistor, and the transistor 12, which is a second transistor, are connected in series with each other, making up a first series-connected circuit 16. The transistor 13, which is another first controlled load transistor, and the transistor 14, which is another second transistor, are connected in series with each other, making up a second series-connected circuit 17. The first series-connected circuit 16 and the second series-connected circuit 17 are connected parallel to each other.

The transistor 15, which is a current control transistor, is connected as a current source to one of the terminals of the series-connected circuits 16, 17 that are connected parallel to each other. A DC power supply 22, 23 is connected across the oscillation units 4, 5, 6.

Each of the first transistors 11, 13 comprises a p-channel MOSFET (Metal Oxide Semiconductor Field Effect Transistor). Each of the second transistors 12, 14 and the current control transistor 15 comprises an n-channel MOSFET.

The oscillation units 4, 5, 6 are successively connected in a ring pattern.

Specifically, a midpoint 18 between the transistors 11, 12 of the first series-connected circuit 16 of the first oscillation unit 4 is connected to the gate of the second transistor 12 of the first series-connected circuit 16 of the second oscillation unit 5.

A midpoint 19 between the transistors 13, 14 of the second series-connected circuit 17 of the first oscillation unit 4 is connected to the gate of the second transistor 14 of the second series-connected circuit 17 of the second oscillation unit 5.

The second oscillation unit 5 and the third oscillation unit 6 are similarly connected to each other, and the third oscillation unit 6 and the first oscillation unit 4 are similarly connected to each other.

In the connection between the third oscillation unit 6 and the first oscillation unit 4, however, the midpoint 18 of the first series-connected circuit 16 is connected to the second transistor 14 of the second series-connected circuit 17, and the midpoint 19 of the second series-connected circuit 17 is connected to the second transistor 12 of the first series-connected circuit 16.

Oscillated output terminals 20, 21 are connected to lines between the first and second oscillation units 4, 5. An output circuit (not shown) for generating a single rectangular pulse from two oscillated signals is connected to the oscillated output terminals 20, 21.

The control circuit 2 connected to the oscillation circuit 3 comprises a plurality of transistors 31–38 and has an input terminal 39 for a control voltage.

The control circuit 2 is connected to the gates of the first controlled load transistors 11, 13 and the current control transistors 15 of the series-connected circuits 16, 17 of the oscillation units 4, 5, 6.

The transistors 36, 38 of the control circuit 2 serve as drive transistors for outputting control signals to the oscillation circuit 3, and have gates and drains connected to each other.

Each of the transistors 32, 33, 35, 38 comprises a p-channel MOSFET, and each of the transistors 31, 33, 36, 37 comprises an n-channel MOSFET.

In the voltage-controlled oscillator 1 of the above structure, the oscillation units 4, 5, 6 each comprising a differential amplifier are successively connected in a ring pattern. The oscillation units 4, 5, 6 can output an oscillated signal from the oscillated output terminals 20, 21, and the frequency of the oscillated signal can be varied by a voltage applied to the control circuit 2.

Specifically, when the control voltage applied to the input terminal 39 of the control circuit 2 is varied, voltages applied to the gates of the transistors 11, 13, 15 of the oscillation units 4, 5, 6 are varied. Therefore, currents flowing through the transistors 11, 13, 15 are varied, varying the frequency of the oscillated signal outputted from the oscillated output terminals 20, 21.

By thus varying the voltages applied to the gates of the first controlled load transistors 11, 13 and the current control transistors 15 of the oscillation units 4, 5, 6, the currents flowing therethrough are varied to vary the frequency of the oscillated signal.

The voltage-controlled oscillator 1 can thus control the frequency of the oscillated signal with the inputted control voltage.

In the voltage-controlled oscillator 1, the transistors 11–15 of the oscillation circuit 3 operate in the saturated range. Therefore, if the transistors 11–15 of the oscillation circuit 3 and the drive transistor 38 in the output stage of the control circuit 2 have their transistor sizes and threshold voltages different from design values, then the oscillated signal may be stopped when the operating points of the oscillation units 4, 5, 6 change.

For example, the oscillating operation of the oscillation circuit 3 was simulated with different gate sizes of the drive transistor 38 of the control circuit 2 which is connected directly to the oscillation circuit 3. It was confirmed from the results of the simulation that, as shown in FIG. 2, when the gate size was increased 10%, the oscillated signal was reduced in level with time until the oscillating operation was stopped.

It is accordingly expected that the oscillating operation of the actual voltage-controlled oscillator may not be stabilized, but may be stopped, if gate sizes and threshold voltages of some transistors are changed due to manufacturing variations from design values.

SUMMARY OF THE INVENTION

It is therefore an object of the present invention to provide a voltage-controlled oscillator which will stably sustain oscillating operation regardless of manufacturing variations from design values.

According to an aspect of the present invention, a voltage-controlled oscillator has an oscillation circuit for producing an oscillated signal, the oscillation circuit comprising a plurality of differential amplifiers connected in a ring pattern, each of the differential amplifiers having controlled load transistors, and a control circuit having a drive transistor disposed at an output stage thereof for outputting a control signal to the oscillation circuit to control the frequency of the oscillated signal produced by the oscillation circuit in response to a control voltage applied to the control circuit, with at least one of the electrodes at opposite terminals of the drive transistor being connected to gates of the controlled load transistors of the differential amplifiers.

The voltage-controlled oscillator according to the first aspect of the present invention also has a feedback circuit for controlling currents flowing in the differential amplifiers based on a DC voltage of the oscillated signal produced by the oscillation circuit.

When the oscillated signal varies to increase or reduce a DC voltage thereof, the feedback circuit controls currents in the differential amplifiers to stabilize the level of the oscillated signal.

Regardless of manufacturing variations of transistor gate sizes and threshold voltages from design values, the oscillating operation of the oscillation circuit is stabilized by the feedback circuit.

Even if the drive transistor of the control circuit suffers such a manufacturing variation, the voltage-controlled oscillator can output a stable oscillated signal.

According to a second aspect of the present invention, a voltage-controlled oscillator has an oscillation circuit comprising a plurality of oscillation units. Each of the oscillation units comprises a pair of series-connected circuits connected parallel to each other, each of the series-connected circuits comprising first and second transistors connected in series with each other across a midpoint, a first current control transistor connected as a current source to one of terminals of the series-connected circuits connected parallel to each other, a power supply connected across each of the oscillation units, the midpoints and the gates of the second transistors in the oscillation units being connected in a ring pattern, and a pair of oscillated output terminals connected to the midpoints in at least one of the oscillation units, for outputting an oscillated signal.

The voltage-controlled oscillator according to the second aspect of the present invention also has a control circuit for applying a variable voltage to the gates of the first transistors in the oscillation units and the gate of the first current control transistor in response to a control voltage applied to the control circuit. A second current control transistor is connected parallel to the first current control transistor. The voltage-controlled oscillator further includes a feedback circuit for applying a voltage depending on a DC voltage of the oscillated signal outputted from the oscillated output terminals, to the gate of the second current control transistor.

When the oscillated signal is reduced to reduce a DC voltage thereof, the feedback circuit lowers the voltage applied to the gate of the current control transistor. A current flowing through the current control transistor, serving as a current source, drops, increasing the level of the oscillated signal.

Conversely, when the oscillated signal is increased in level to increase a DC voltage thereof, the feedback circuit increases the voltage applied to the gate of the current control transistor. A current flowing through the current control transistor increases, reducing the level of the oscillated signal.

Generally, transistor gate sizes and threshold voltages tend to suffer manufacturing variations from design values. The voltage-controlled oscillator according to the present invention has the feedback circuit for stabilizing the oscillating operation of the oscillation units.

Therefore, regardless of a manufacturing variation which the drive transistor suffers from a design value, the voltage-controlled oscillator can output a stable oscillated signal.

The voltage-controlled oscillator may have a plurality of feedback circuits connected respectively to the oscillation units. The feedback circuits connected respectively to the oscillation units individually control the oscillating operation of the oscillation units. As a consequence, the oscillating operation of the oscillation units is stabilized even in the presence of a relative error between the oscillation units.

Alternatively, the feedback circuit may be connected in common to the oscillation units. Since the oscillating operation of the oscillation units is controlled by the single feedback circuit, the voltage-controlled oscillator can stabilize the oscillated signal with a relatively simple circuit arrangement.

The first transistor may comprise a p-channel MOSFET, and the second transistor may comprise an n-channel MOSFET. Therefore, each of the oscillation units can be designed for a minimum circuit scale, and hence the oscillation circuit can be designed with ease.

At least one of the transistors of the control circuit and the oscillation circuit may suffer a variation from a design value. Therefore, it is possible to develop a current difference between the oscillation units for generating an oscillation trigger.

The above and other objects, features, and advantages of the present invention will become apparent from the following description with reference to the accompanying drawings which illustrate an example of the present invention.

DETAILED DESCRIPTION OF THE PREFERRED EMBODIMENT

Figure 1:
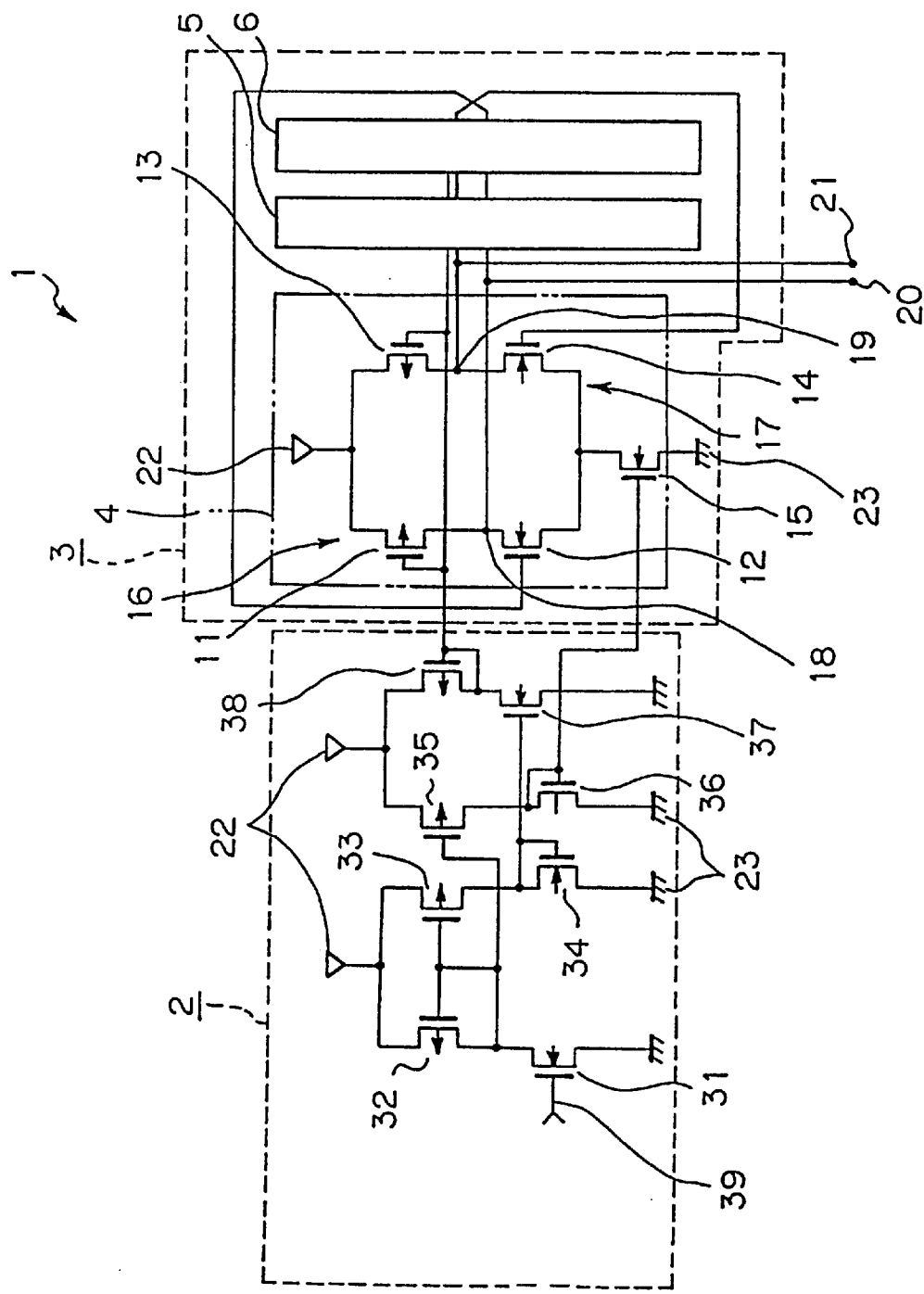
FIG. 1 is a circuit diagram of a conventional voltage-controlled oscillator.
Figure 2:
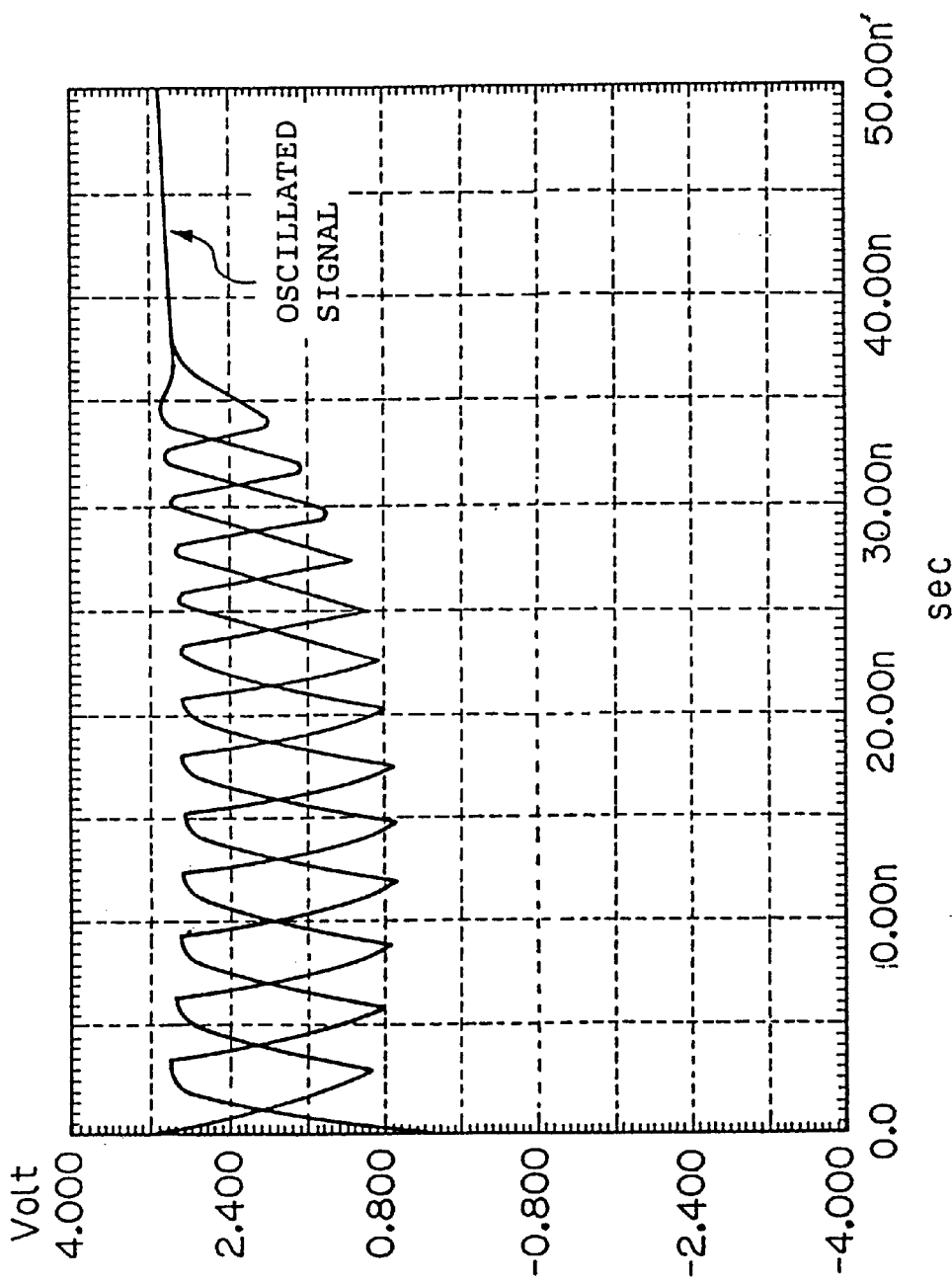
FIG. 2 is a diagram showing results of a simulation of the oscillating operation of the conventional voltage-controlled oscillator.
Figure 3:
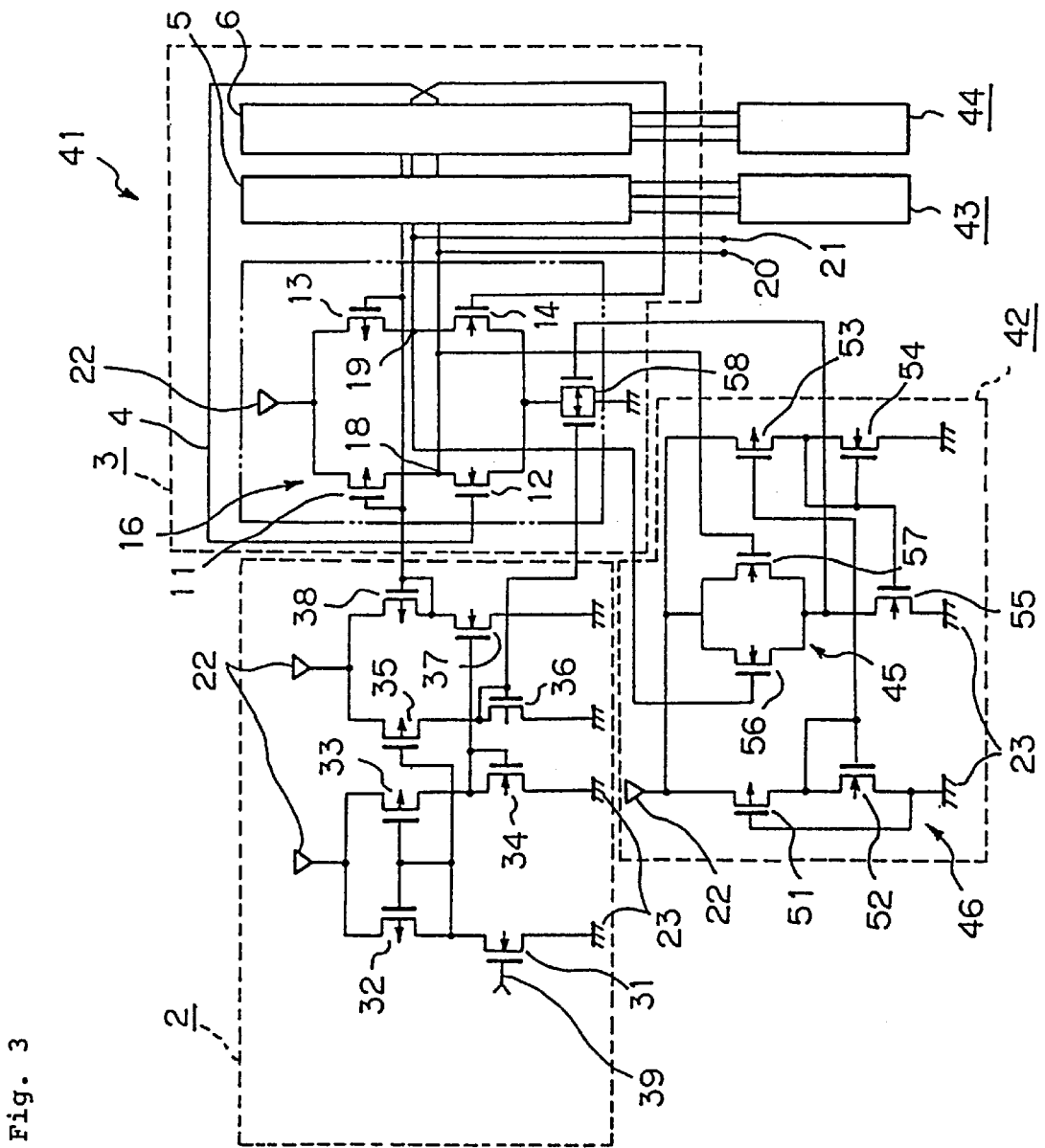
FIG. 3 is a circuit diagram of a voltage-controlled oscillator according to the present invention.

As shown in FIG. 3, a voltage-controlled oscillator 41 according to the present invention comprises a control circuit 2, an oscillation circuit 3, and three feedback circuits 42, 43, 44. The control circuit 2 and the oscillation circuit 3 are basically the same as the control circuit 2 and the oscillation circuit 3 of the conventional voltage-controlled oscillator 1 shown in FIG. 1. Therefore, those parts of the control circuit 2 and the oscillation circuit 3 which are identical to those of the control circuit 2 and the oscillation circuit 3 of the conventional voltage-controlled oscillator 1 are denoted by identical reference numerals, and will not be described in detail below.

The feedback circuits 42, 43, 44 are connected respectively to the oscillation units 4, 5, 6 of the oscillation circuit 3. Each of the feedback circuits 42, 43, 44 comprises a controller 45 and a power supply 46.

The power supply 46 comprises four transistors 51, 52, 53, 54. The controller 45 comprises three transistors 55, 56, 57 which are connected to the oscillation unit 4–6.

Each of the transistors 51, 53 comprises a p-channel MOSFET, and each of the transistors 52, 54, 55, 56, 57 comprises an n-channel MOSFET.

In each of the feedback circuits 42, 43, 44, the transistors 56, 57 are connected parallel to each other, and the power supply 46 is connected across the transistors 56, 57.

The transistors 56, 57 have respective gates connected to the oscillated output terminals 20, 21 of the oscillation units 4, 5, 6. The controller 45 has a control output terminal connected to the gate of a current control transistor 58 which serves as a current source in each of the oscillation units 4, 5, 6.

The current control transistor 58 comprises a pair of first and second current control transistors connected parallel to each other. Each of these first and second current control transistors comprises an n-channel MOSFET.

The first current control transistor has a gate connected to the drain and gate of the drive transistor 36 of the control circuit 2, and the second current control transistor has a gate connected to the control output terminal of the feedback circuit 42.

The voltage-controlled oscillator 41 outputs an oscillated signal from the oscillated output terminals 20, 21. The frequency of the oscillated signal can be varied by a control voltage applied to the control circuit 2.

Even if the drive transistor 38 of the control circuit 2 and the first controlled load transistors 11, 13 of the oscillation units 4, 5, 6 suffer manufacturing variations from design values, the feedback circuit 42 controls the oscillation units 4, 5, 6 through a feedback loop based on a DC voltage of the oscillated signal outputted from the oscillation circuit 3.

Therefore, the voltage-controlled oscillator 41 can output a stable oscillated signal which will not be accidentally stopped. The manufacturing variations which the transistors may suffer from design values include variations in the gate length, the gate width, and the threshold voltage (VT).

For example, if the drive transistor 38 of the control circuit 2 suffers at least one of an increased gate length, a reduced gate width, or an increased threshold voltage as a result of a manufacturing variation from a design value, then the voltage of the control signal outputted from the drive transistor 38 drops.

Such a manufacturing variation of the drive transistor 38 results in a reduction in the current driving capability thereof, i.e., an increase in the on resistance thereof. In this, the gate voltages of the first controlled load transistors 11, 13 of the oscillation units 4, 5, 6 are lowered, and their "on" resistances are increased, so that the DC voltage of the oscillated signal falls.

When the oscillated signal outputted from the oscillation units 4, 5, 6 to the oscillated output terminals 20, 21 is thus reduced in level to lower its DC voltage, the voltage applied to the gates of the transistors 56, 57 of the controller 45 of the feedback circuit 42 drops, lowering the voltage of the control signal applied from the feedback circuit 42 to the second gate of the current control transistor 58.

Therefore, a current flowing through the current control transistor 58 as the current source is reduced, resulting in an increase in the level of the oscillated signal.

If the drive transistor 38 of the control circuit 2 suffers at least one of a reduced gate length, an increased gate width, or a reduced threshold voltage as a result of a manufacturing variation from a design value, then the voltage of the control signal outputted from the drive transistor 38 increases.

Such a manufacturing variation of the drive transistor 38 results in an increase in the current driving capability thereof, i.e., a reduction in the "on" resistance thereof. In this case, the gate voltages of the first controlled load transistors 11, 13 of the oscillation units 4, 5, 6 are increased, and their "on" resistances are reduced, so that the DC voltage of the oscillated signal rises.

Conversely, when the oscillated signal outputted from the oscillation units 4, 5, 6 to the oscillated output terminals 20, 21 is thus increased in level to increase its DC voltage, the voltage applied to the gates of the transistors 56, 57 of the controller 45 of the feedback circuit 42 increases, increasing the voltage of the control signal applied from the feedback circuit 42 to the second gate of the current control transistor 58.

Therefore, a current flowing through the current control transistor 58 as the current source is increased, resulting in a reduction in the level of the oscillated signal.

Regardless of a manufacturing variation which the drive transistor 38 suffers from a design value, the feedback circuit 42 thus controls the oscillation units 4, 5, 6 through a feedback loop based on the oscillated signal. Consequently, the voltage-controlled oscillator 41 can output a stable oscillated signal.

In the voltage-controlled oscillator 41, each of the first transistors 11, 13 of the oscillation unit 4 comprises a p-channel MOSFET and each of the second transistors 12, 14 comprises an n-channel MOSFET. Therefore, the oscillation unit 4 can be designed for a minimum circuit scale, and hence the oscillation circuit 3 can be designed with ease.

Furthermore, it is likely that at least one of the transistors 38, 11–14 of the control circuit 2 and the oscillation circuit 3 with a manufacturing variation from a design value. Therefore, it is possible to develop a current difference between the oscillation units 4, 5, 6 for generating an oscillation trigger.

In the above description, it is assumed that the drive transistor 38 of the control circuit 2 suffers a design variation. However, even when the controlled load transistors 11, 13 of the oscillation units 4, 5, 6 suffer a design variation, the voltage-controlled oscillator 41 can output a stable oscillated signal because the feedback circuit 42 controls the oscillation units 4, 5, 6 through a feedback loop based on the oscillated signal.

In the voltage-controlled oscillator 41, the feedback circuits 42, 43, 44 are connected individually to the respective oscillation units 4, 5, 6. Therefore, the oscillating operation of the oscillation units 4, 5, 6 can individually be controlled by the feedback circuits 42, 43, 44. As a consequence, the oscillating operation of the oscillation units 4, 5, 6 is stabilized even in the presence of a relative error between the oscillation units 4, 5, 6.

However, if any relative error present between the oscillation units 4, 5, 6 is made very small under manufacturing conditions, then the oscillation units 4, 5, 6 may be connected to a single feedback circuit to achieve stable oscillating operation. Alternatively, the feedback circuits 42, 43, 44 may have respective controllers 45, but a single common power supply 46 connected to these controllers 45.

In the illustrated embodiment, the current control transistor 58 connected between the control circuit 2 and the feedback circuit 42 comprises first and second current control transistors connected parallel to each other. However, such first and second current control transistors may be connected in series with each other.

While a preferred embodiment of the present invention has been described using specific terms, such description is for illustrative purposes only, and it is to be understood that changes and variations may be made without departing from the spirit or scope of the following claims.

What is claimed is:

1. A voltage-controlled oscillator comprising:
    an oscillation circuit for producing an oscillated signal, said oscillation circuit comprising a plurality of differential amplifiers connected in a ring pattern,
    each of said differential amplifiers having a controlled load transistor and being connected in series to first and second parallel current control transistors,
    said second parallel current transistor having a gate for receiving a current control feedback signal;
    a control circuit having a drive transistor disposed at an output stage thereof,
    said drive transistor outputting a control signal to said oscillation circuit to control the frequency of the oscillated signal produced by said oscillation circuit in response to a control voltage applied to said control circuit;
    a line connecting a gate electrode and one of two opposing end electrodes of said drive transistor to gates of each of said controlled load transistors of said differential amplifiers; and
    a feedback circuit for controlling current flowing in said differential amplifiers based on a DC voltage of the oscillated signal produced by said oscillation circuit.

2. A voltage-controlled oscillator comprising:
    an oscillation circuit comprising a plurality of oscillation units, each of said oscillation units comprising:
        a pair of series-connected circuits connected parallel to each other, each of said series-connected circuits comprising first and second transistors connected in series with each other across a midpoint;
        a first current control transistor connected as a current source to one of terminals of said series-connected circuits connected parallel to each other;
        a power supply connected across each of said oscillation units;
        the midpoints and the gates of said second transistors in said oscillation units being connected in a ring pattern; and
        a pair of oscillated output terminals connected to the midpoints in at least one of said oscillation units, for outputting an oscillated signal;
    a control circuit for applying a variable voltage to the gates of said first transistors in said oscillation units and the gate of said first current control transistor in response to a control voltage applied to the control circuit;
    a second current control transistor connected parallel to said first current control transistor; and
    a feedback circuit for applying a voltage depending on a DC voltage of the oscillated signal outputted from said oscillated output terminals, to the gate of said second current control transistor.

3. A voltage-controlled oscillator according to claim 2, comprising a plurality of feedback circuits connected respectively to said oscillation units.

4. A voltage-controlled oscillator according to claim 2, wherein said feedback circuit is connected in common to said oscillation units.

5. A voltage-controlled oscillator according to claim 2, wherein said first transistor comprises a p-channel MOSFET, and said second transistor comprises an n-channel MOSFET.

6. A voltage-controlled oscillator comprising:
    an oscillation circuit for producing an oscillated signal, wherein said oscillation circuit comprises a plurality of differential amplifiers connected in a ring pattern, and wherein each of said differential amplifiers has a controlled load transistor;
    a control circuit having a drive transistor disposed at an output stage thereof for outputting a control signal to said oscillation circuit to control the frequency of the oscillated signal produced by said oscillation circuit in response to a control voltage applied to said control circuit, wherein said control circuit drive transistor has a gate and two opposing ends, and wherein said gate and said opposing ends have electrodes;
    a conductive line connecting said gate electrode and one of said two opposing end electrodes of said control circuit drive transistor to gates of each of said controlled load transistors of said differential amplifiers;
    a feedback circuit for controlling current flowing in said differential amplifiers based on the oscillated signal produced by said oscillation circuit,
    said feedback circuit being designed and adapted to receive a first and second oscillatory input signal from said oscillation circuit and to provide a feedback control signal to said oscillation circuit, and
    wherein at least one of said controlled load transistors in said differential amplifier of said oscillation circuit and said control circuit drive transistor suffers a fabrication variation from a design value.

7. The voltage-controlled oscillator of claim 2, wherein said control circuit further comprises at least one drive transistor, and wherein at least one of said first transistor of said series-connected circuit of said oscillation circuit and said at least one drive transistor of said control circuit suffers a fabrication variation from a design value.

8. The voltage-controlled oscillator of claim 1, wherein said feedback circuit comprises a differential amplifier.

9. The voltage-controlled oscillator of claim 2, wherein said feedback circuit comprises a differential amplifier.

10. The voltage-controlled oscillator of claim 6, wherein said feedback circuit comprises a differential amplifier.

* * * * *